United States Patent
Lin et al.

[11] Patent Number: 5,904,528
[45] Date of Patent: May 18, 1999

[54] METHOD OF FORMING ASYMMETRICALLY DOPED SOURCE/DRAIN REGIONS

[75] Inventors: Ming-Ren Lin, Cupertino; Peng Fang, San Jose; Donald L. Wollesen, Saratoga, all of Calif.

[73] Assignee: Advanced Micro Devices, Inc., Sunnyvale, Calif.

[21] Appl. No.: 08/785,213

[22] Filed: Jan. 17, 1997

[51] Int. Cl.$^6$ ..................................... H01L 21/336
[52] U.S. Cl. ........................................ 438/286; 438/305
[58] Field of Search ................................ 438/286, 305, 438/307

[56] References Cited

U.S. PATENT DOCUMENTS 5,200,351  4/1993  Hadjizadeh-Amini .
5,286,664  2/1994  Horiuchi .
5,413,969  5/1995  Huang .
5,573,965  11/1996 Chen et al. .
5,602,055  2/1997  Nicholls et al. .
5,759,897  6/1998  Kadosh et al. ........................ 438/286

FOREIGN PATENT DOCUMENTS 1-191473  8/1989  Japan ..................................... 438/175

OTHER PUBLICATIONS

Horiuchi et al., "An Asymmetric Sidewall Process of High Performance LDD MOSFET's," IEEE Transactions on Electron Devices, vol. 41, No. 2, Feb. 1994, pp. 186–190.

*Primary Examiner*—Richard A. Booth

[57] ABSTRACT

Asymmetrically doped source/drain regions of a transistor are formed employing protective insulating layers to prevent a portion of the gate electrode from receiving an excessive impurity implantation dose and penetrating through the underlying gate insulating layer into the semiconductor substrate. Sidewall spacers are employed during heavy implantation.

2 Claims, 5 Drawing Sheets

METHOD OF FORMING ASYMMETRICALLY DOPED SOURCE/ DRAIN REGIONS

TECHNICAL FIELD

The present invention is directed to a method of manufacturing a semiconductor device comprising a transistor with asymmetrically doped source/drain regions. The invention has particular applicability in semiconductor devices with sub-micron technology and/or designed for high operating speeds.

BACKGROUND ART

The escalating requirements for increased densification and performance in ultra-large scale integration semiconductor wiring require integrated circuits capable of operating at higher speeds while having reduced-size geometries and greater packing densities. As geometries shrink into the sub-micron range, channel lengths are reduced, thereby exacerbating the impact of hot-carrier effects with a consequential degradation in CMOS performance.

It is recognized that source side parasitic resistance induces a serious decrease in the drain current of a MOSFET. Explanations include a decrease in the effective gate voltage from the self-biased negative feedback. See Horiuchi et al., "An Asymmetric Sidewall Process of High Performance LDD MOSFET's, " IEEE Transactions on Electron Devices, Vol. 41, No. 2, February 1994, pp. 186–190. Horiuchi et al. report that the drain current is not significantly effected by the drain side parasitic resistance when the MOSFET is operated in the saturation region. Several prior art attempts to address the source parasitic resistance problem include the formation of a double-diffused drain and a lightly doped drain (LDD) or a moderately doped drain (MDD).

As used throughout the present disclosure, LDD denotes a conventional lightly doped source/drain implant, typically having an impurity concentration of about $2 \times 10^{18}$ to about $5 \times 10^{18}$ atoms/cm$^3$. As used throughout the present disclosure, the expression MDD denotes a conventional moderately doped source/drain implant, typically having an impurity concentration of about $5 \times 10^{18}$ to about $2 \times 10^{19}$ atoms/cm$^3$. As also used throughout this application, HDD denotes a conventional heavily doped source/drain implant, typically having an impurity concentration of about $2 \times 10^{19}$ to about $2 \times 10^{20}$ atoms/cm$^3$.

A conventional LDD/MDD transistor structure is illustrated in FIG. 1 and comprises substrate 10 having an active region isolated by surrounding field oxide region 11. The active region includes a MOSFET comprising source/drain regions 12, 13, and gate electrode 14 spaced apart from semiconductor substrate 10 by gate insulating layer 15. Sidewall spacers 16 are formed on side surfaces of gate electrode 14 serving to mask portions of the LDD/MDD implants during HDD implantations. Source/drain regions 12, 13 are characterized by LDD/MDD regions 17A and HDD regions 17B. The LDD/MDD implanted junction is designated by reference numeral 18, while the source/drain implant junction is designated by reference numeral 19.

The requirement for reduced geometries necessitates reduced channel lengths and gate insulating layers having reduced thicknesses. The conventional LDD/MDD transistor structure depicted in FIG. 1, consequently, becomes less effective in remedying performance degradation, particularly due to the increased parasitic resistance of the source and consequential decreased drain current. Moreover, conventional techniques for forming a typical LDD/MDD type of transistor structure depicted in FIG. 1 are complex and generates additional performance problems. Accordingly, efforts have been made to provide an asymmetrically doped source/drain transistor structure.

A conventional asymmetrically doped source/drain MOSFET structure is depicted in FIG. 2 and comprises semiconductor substrate 20 having an active region isolated by surrounding field oxide region 21. The active region includes a MOSFET comprising drain region 22, source region 23, and gate electrode 24 spaced apart from semiconductor substrate 20 by gate insulating layer 25. Sidewall spacers 26 are selectively formed on the side surfaces of gate electrode 24, and comprise a conventional sidewall spacer insulating material, such as silicon dioxide or polycrystalline silicon. The MOSFET structure of FIG. 2 differs from that of FIG. 1, in that source region 23 does not contain LDD/MDD region 27 as formed in drain region 22; whereas, both the source 12 and drain 13 regions of the FIG. 1 MOSFET comprise LDD/MDD implants 17A. Thus, a conventional asymmetric source/drain structure comprises an LDD/MDD junction formed only in the drain region. In this way, the source side resistance and the voltage across the gate electrode to the source junction are reduced, thereby improving the saturation drive current and transistor reliability, particularly hot-carrier injection.

A conventional method of forming an asymmetric source/drain structure, such as that depicted in FIG. 2, comprises photoresistive masking and selectively forming sidewall spacers, as disclosed by Horiuchi et al. For example, sequential stages of a conventional method for forming an asymmetrical source/drain transistor are depicted in FIGS. 3 and 4. Adverting to FIG. 3, gate electrode 31 is formed on semiconductor substrate 30 with gate insulating layer 32 therebetween. A conventional LDD/MDD impurity implantation is conducted using gate electrode 31 as a mask to form LDD/MDD source/drain implants 33. A conventional LDD impurity implantation is typically conducted at an implantation energy of about 20 Kev to about 40 Kev to form an LDD implant having an impurity concentration of about $2 \times 10^{18}$ to about $5 \times 10^{18}$ atoms/cm$^3$. A conventional MDD impurity implantation is typically conducted at an implantation energy of about 10 Kev to about 20 Kev to form an MDD implant having an impurity concentration of about $5 \times 10^{18}$ to about $2 \times 10^{19}$ atoms/cm$^3$.

An asymmetric photoresist mask 34 is formed covering drain region D. An HDD impurity implantation, indicated by arrows 36, is conducted to form an HDD source implant 35. A conventional HDD impurity implantation is typically conducted at an implantation energy of about 1 Kev to about 10 Kev to form an HDD implant having an impurity concentration of about $2 \times 10^{+19}$ to about $2 \times 10^{+20}$ atoms/cm$^3$.

Asymmetric photoresist mask 34 is then removed, and sidewall spacers 40 are formed on the side surfaces of gate electrode 31, as illustrated in FIG. 4. With continued reference to FIG. 4, a second HDD impurity implantation, indicated by arrows 41, is conducted to form HDD source/drain implants 42, thereby forming the basic asymmetrically doped source/drain regions of the MOSFET. Thermal treatment is conventionally conducted after the implantations or during subsequent processing to complete and activate the source/drain regions.

The conventional procedure illustrated in FIGS. 3 and 4 is problematic, particularly for deep sub-micron transistor generations, wherein a thin gate dielectric is employed, typically about 15 Å to about 200 Å. Such problems stem, in part, from the penetration of impurities during the HDD implantations into gate electrode 31, illustrated by impurity atoms 37 in FIG. 3, and impurity atoms 37 and 43 in FIG. 4. As a result, a portion of the gate electrode receives an excessive impurity dosage which, in turn, causes penetration through increasingly thinner gate insulating layers and into semiconductor substrate 30, as into a portion of the channel region designated by reference numeral X in FIG. 4. Such penetration of the semiconductor substrate in the channel region deteriorates transistor performance and characteristics, as by causing a shift in the threshold voltage. As a practical matter, perfect alignment of the photoresist and the side surface of the gate electrode (FIG. 3) cannot be achieved. Accordingly, due to the requisite misalignment tolerance for shielding drain region D during the initial HDD source implantation, impurity penetration into a portion of the channel region of the semiconductor substrate is exacerbated.

Accordingly, there is a need for semiconductor methodology to form asymmetrically doped source/drain regions of an MOSFET, wherein impurity penetration of the gate insulating layer into the channel region of the semiconductor substrate is prevented. There further exists a need for simplified, deep sub-micron semiconductor methodology, wherein the resulting transistor comprises an asymmetrically doped source/drain region exhibiting an increased operating speed, improved reliability and an improved signal-to-noise ratio.

DISCLOSURE OF THE INVENTION

An object of the present invention is an efficient, cost effective method of manufacturing a semiconductor device having an increased operating speed, improved reliability and improved signal-to-noise ratio.

Another object of the present invention is a method of manufacturing a semiconductor device comprising an asymmetric source/drain structure while reducing penetration of implanted impurities through the gate insulating layer into the channel region of the semiconductor substrate.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device containing a transistor with asymmetrically doped source/drain regions, which method comprises: depositing a gate conductive layer on a semiconductor substrate with a gate insulating layer therebetween; forming a first insulating layer, comprising a first insulating material, on the gate conductive layer; forming a second insulating layer, comprising a second insulating material different from the first insulating material, on the first insulating to form a composite stack; etching the composite stack to form a gate electrode stack having side surfaces and an upper surface, thereby exposing the semiconductor substrate adjacent each side surface; implanting impurity atoms into the semiconductor substrate, using the gate stack as a mask, to form LDD or MDD source/drain implants of the transistor having a first impurity concentration; forming a photoresist mask covering a portion of the gate stack upper surface and the drain region leaving the source region on a portion of the gate stack upper surface exposed; and implanting impurity atoms into the source region forming an HDD implant at a second impurity concentration greater than the first impurity concentration.

Another aspect of the present invention is a method of manufacturing a semiconductor device containing a transistor with asymmetrically doped source/drain regions, which method comprises: depositing a gate conductive layer on a semiconductor substrate with a gate insulating layer therebetween; forming a first insulating layer, comprising a first insulating material, on the gate conductive layer; forming a second insulating layer, comprising a second insulating material different from the first insulating material, on the first insulating layer to form a composite stack; etching the composite stack to form a gate electrode stack having side surfaces and an upper surface, thereby exposing the semiconductor substrate adjacent each side surface; implanting impurity atoms into the exposed semiconductor substrate, using the gate stack as a mask, to form LDD or MDD source/drain implants of the transistor having a first impurity concentration; forming a photoresist mask covering a portion of the gate stack upper surface and the drain region leaving the source region and a portion of the gate stack upper surface exposed; implanting impurity atoms into the source region forming an HDD implant at a second impurity concentration greater than the first impurity concentration; removing the photoresist mask; forming an insulating sidewall spacer on each side surface of the gate stack; removing the remaining portion of the second insulating layer from the gate stack; and implanting impurity atoms, using the remaining gate stack and insulating sidewall spacers as a mask, into the source/drain regions to form second HDD implants at an impurity concentration greater than the first impurity concentration.

A further aspect of the present invention is a method of manufacturing a semiconductor device containing a transistor having asymmetrically doped source/drain regions, which method comprises: forming a gate electrode having side surfaces on a semiconductor substrate with a gate insulating layer therebetween; implanting impurity ions into the semiconductor substrate, using the gate electrode as a mask, to form LDD or MDD source/drain implants having a first impurity concentration; forming a first insulating layer, comprising a first insulating material, on the gate electrode, including the side surfaces thereof; forming a sidewall spacer on a side surface of the gate electrode adjacent the drain region; and implanting impurity atoms into the semiconductor substrate, using the sidewall spacer as a mask, to form HDD source/drain implants having an impurity concentration greater than the first impurity concentration.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
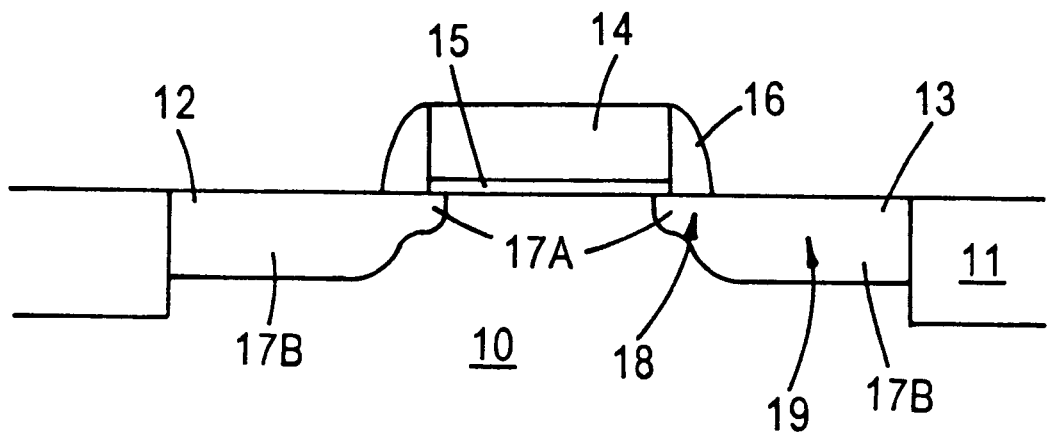
FIG. 1 schematically illustrates a conventional MOSFET having an LDD/MDD structure.
Figure 2:
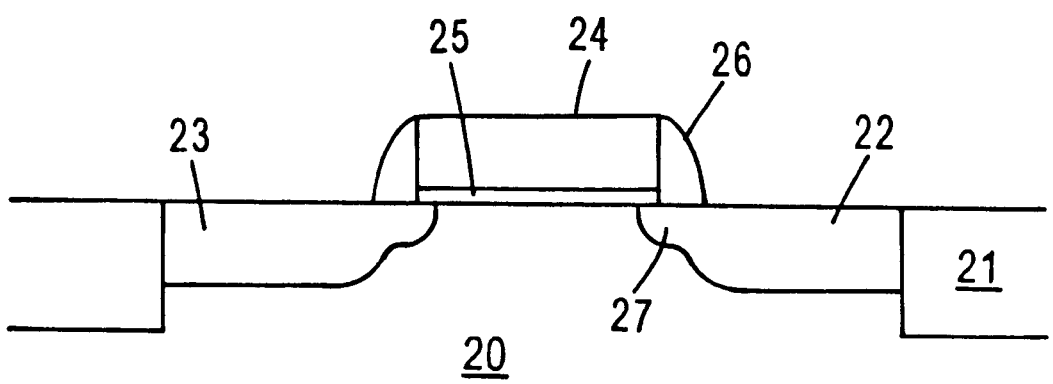
FIG. 2 illustrates a conventional MOSFET having an asymmetrical source/drain structure.
Figure 3:
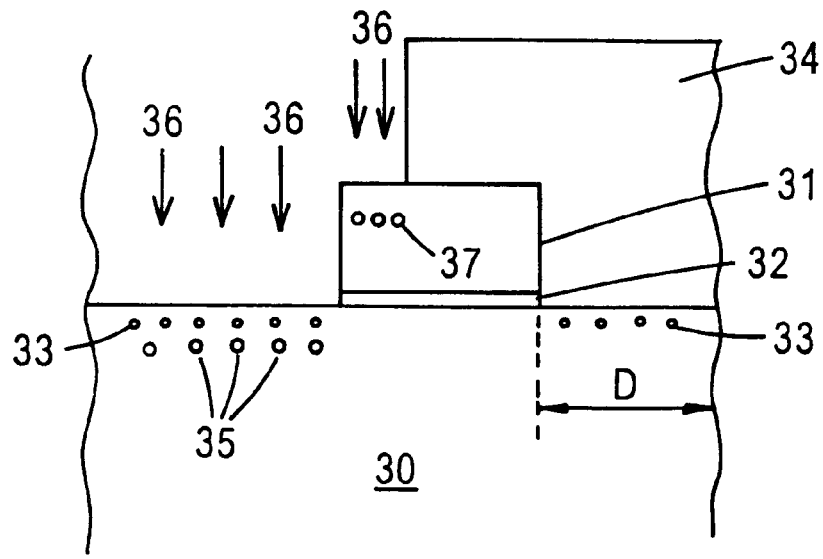
FIGS. 3 and 4 schematically illustrate sequential stages of a conventional method of forming an MOSFET having an asymmetrical source/drain structure.
Figure 4:
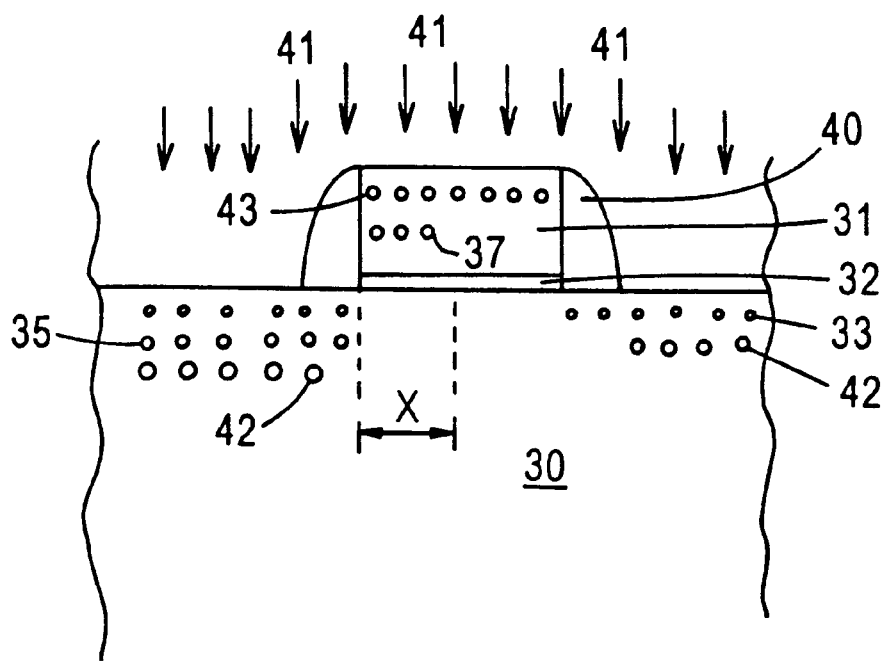

The present invention provides advanced CMOS methodology for deep sub-micron semiconductor devices, thereby facilitating formation of high density circuitry having an increased operating speed, improved reliability and improved signal-to-noise ratio. In accordance with the present invention, a simplified, cost effective method is provided which enables formation of MOSFETs, including CMOS transistors, with asymmetrically doped source/drain regions, without encountering the problems attendant upon conventional techniques, particularly problems due to impurity penetration through the gate insulating layer into the channel region of the semiconductor device. In accordance with the present invention, transistors having asymmetrically doped source/drain regions are formed while substantially preventing a portion of the gate electrode from receiving an excessive impurity implantation dosage. The prevention of such an excessively dosed impurity region in the gate electrode, in turn, prevents penetration of implanted impurities through the gate insulating layer into the channel region of the semiconductor substrate. This objective is achieved in the present invention by masking the gate electrode during HDD implantation, thereby substantially preventing a portion of the gate electrode from receiving an excessive impurity implantation dosage.

In an embodiment of the present invention, a gate conductive layer which is subsequently patterned to form a gate electrode, such as polycrystalline silicon, is formed on a semiconductor substrate with a gate insulating layer therebetween. A first insulating layer, comprising a first insulating material, is formed on the conductive layer and a second insulating layer, comprising a second insulating material different from the first insulating material, is formed on the first insulating layer. The second insulating material is selected to prevent penetration of impurities during HDD implantation into the unmasked portion of the gate electrode while an asymmetric photoresist mask shields the remaining portion of the gate electrode and the drain region. Suitable materials for the second insulating layer include silicon nitride. The second insulating layer can be deposited at a thickness of about 50 Å to about 2000 Å. The first insulating material is selected to protect the gate during subsequent removal of the second insulating layer. Suitable materials for the first insulating layer include silicon oxide. The first insulating layer can be deposited at a thickness of about 50 Å to about 2000 Å.

After deposition of the gate conductive layer, and first and second insulating layers sequentially thereon, etching is conducted through a mask to form a gate electrode stack comprising, sequentially, a gate insulating layer, gate electrode, first insulating layer and second insulating layer. A conventional LDD/MDD implant is conducted to form HDD/MDD source/drain implants. Subsequently, a photoresist mask is formed covering a portion of the gate electrode stack and the drain region, and an HDD source implantation is conducted, during which impurity atoms are stopped in the second insulating layer and substantially prevented from penetrating the gate electrode. The photoresist mask is then removed along the second insulating layer. Sidewall spacers are then selectively formed on the side surfaces of the remaining gate electrode stack, and an HDD source/drain implantation is conducted to form HDD source/drain implants, thereby completing the basic asymmetric source/drain structure. As one having ordinary skill in the art would recognize, actual completion and activation of the source/drain regions occurs upon thermal annealing, which can be performed after each impurity implantation, upon completion of the basic asymmetric source/drain structure or during subsequent processing.

Figure 5:
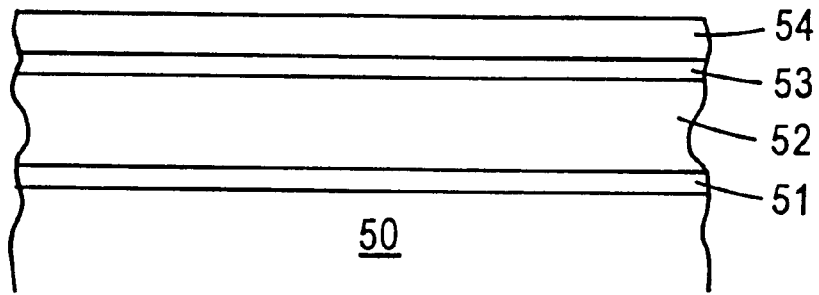
FIGS. 5 through 8 schematically illustrate sequential stages of a method in accordance with an embodiment of the present invention.
Figure 6:
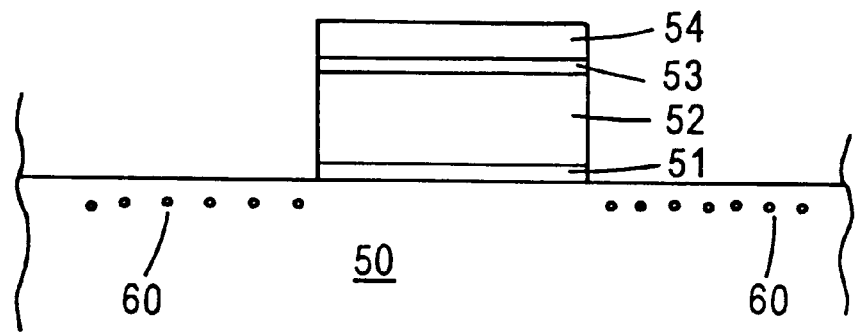
Figure 7:
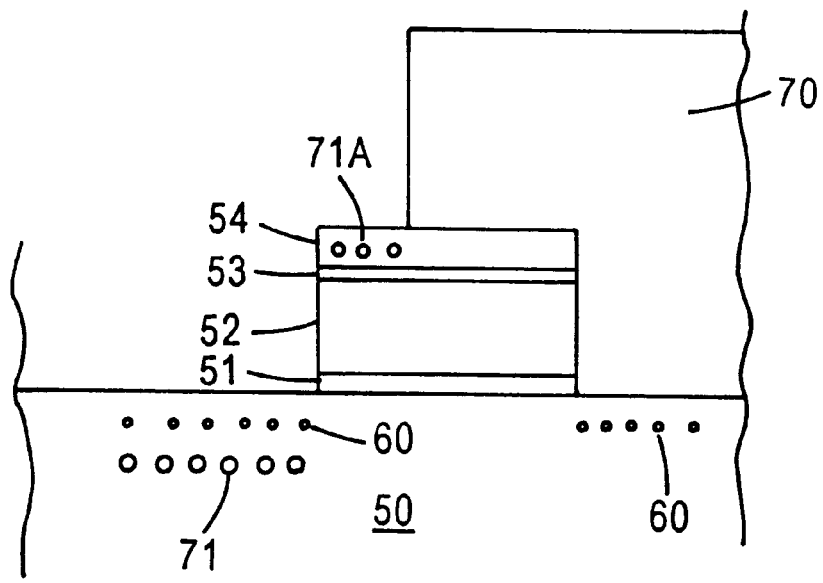

An embodiment of the present invention is illustrated with respect to FIGS. 5 through 7. As shown in FIG. 5, gate insulating layer 51 is formed on semiconductor substrate 50, and a gate conductive layer 52, such as polycrystalline silicon, is deposited on gate insulating layer 51. In accordance with the present invention, a first insulating layer 53 and second insulating layer 54, are sequentially deposited on gate conductive layer 52. First insulating layer 53 comprises a first insulating material which is different from the second insulating material of second insulating layer 54. The second material insulating layer 54 is selected to substantially prevent impurities from penetrating into the underlying gate electrode portion of conductive layer 52 during HDD impurity implantation. The degree of effectiveness of second insulating layer 54 in preventing penetration depends upon the particular material and thickness of the second insulating layer. One having ordinary skill in the art, given the disclosed objective, can easily optimize the thickness of second insulating layer 54, depending upon the particular second insulating material, to substantially prevent impurity penetration into the underlying gate electrode. For example, the second insulating layer 54 can be deposited at a thickness of about 50 Å to about 2000 Å. Suitable materials for second insulating layer 54 includes silicon nitride.

The first insulating material is chosen to protect the gate electrode during subsequent removal of the second insulating layer 54. First insulating layer 53 can be deposited at a thickness of about 50 Å to about 2000 Å. Suitable first insulating materials include silicon oxide.

After deposition of the first and second insulating layers on gate conductive layer 52, patterning is conducted in accordance with conventional photolithographic and etching techniques to form a gate electrode stack, shown in FIG. 6, comprising, sequentially, remaining portions of gate oxide layer 51, gate conductive layer, i.e., gate electrode 52, first insulating layer 53 and second insulating layer 54. An LDD/MDD impurity implantation is then conducted to form LDD/MDD source/drain implants 60.

Adverting to FIG. 7, an asymmetric photoresist mask 70 is then formed on a portion of the gate electrode stack and on drain region. An HDD impurity implantation is then conducted to form HDD source implant 71. During such HDD impurity implantation, impurities are trapped in second insulating layer 54, designated by reference numeral 71A, and substantially prevented from penetrating into gate electrode 52.

Figure 8:
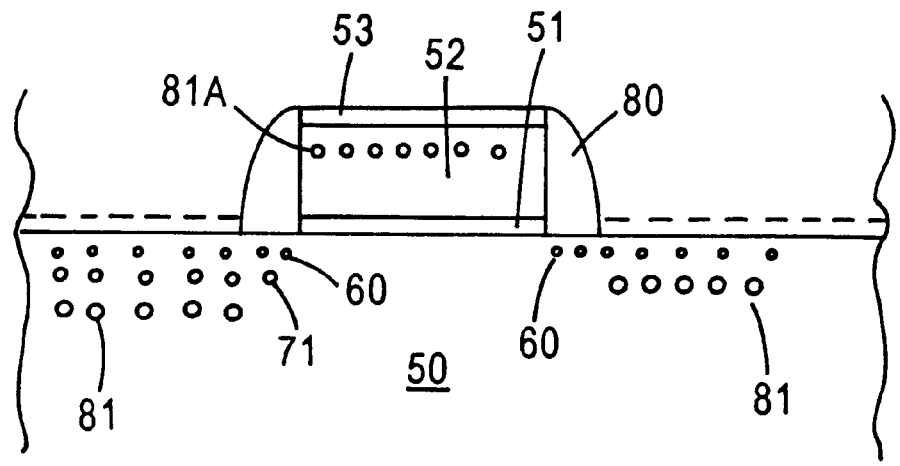

With reference to FIG. 8, asymmetric photoresist mask 70 is removed, and second insulating layer 54 is then removed along with trapped impurities 71A. Insulative sidewall spacers 80, which can comprise $SiO_2$ or polycrystalline silicon, are then formed on the side surfaces of the remaining gate electrode stack. A second HDD impurity implantation is conducted to form HDD source/drain implants 81. During the second HDD implantation, impurity atoms designated by reference numeral 81A, penetrate into gate electrode 52. However, such penetration does not form an excessively dosed portion and, hence, does not result in impurity penetration through the gate insulating layer into the channel region of the semiconductor substrate to adversely affect transistor performance. Thus, a MOSFET having asymmetrically doped source/drain regions is formed as shown in FIGS. 5 through 8, wherein the gate electrode is protected from impurity penetration during HDD implantation, thereby substantially avoiding the creation of an excessively dosed region.

The present invention involves the use of conventional equipment, deposition, photolithographic and etching techniques, and conventional materials. The LDD/MDD and subsequent HDD impurity implantations are conducted using conventional equipment and conventional parameters to achieve conventional implant concentrations. The present invention departs from conventional methodology by shielding the gate electrode during HDD implantation and substantially preventing the formation of an excessively dosed impurity region therein.

In another embodiment of the present invention, a MOSFET having asymmetrically doped source/drain regions is formed by a simplified technique which does not require the use of an asymmetric photoresist mask during HDD implantation. In this embodiment, a gate electrode is formed on a semiconductor substrate with a gate insulating layer therebetween. A conventional LDD/MDD impurity implantation is conducted to form LDD/MDD source/drain implants. A first insulating layer is formed to seal the gate electrode. An optional second insulating layer, comprising an insulating differential different from the insulating material of the first insulating layer, can be deposited on the first insulating layer. A sidewall spacer is then selectively formed on the drain side of the gate electrode. An HDD implantation is then conducted to form HDD source/drain implants using the sidewall spacer as a mask, thereby completing the basic asymmetric source/drain structure. Such an embodiment is partially illustrated with respect to FIG. 9.

Figure 9:
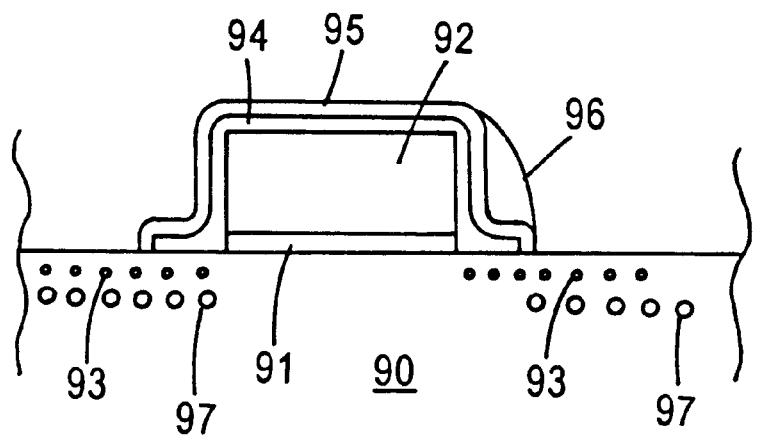
FIG. 9 illustrates another embodiment of the present invention.

As shown in FIG. 9, gate electrode 92 is formed on semiconductor substrate 90 with gate insulating layer 91 therebetween. A first insulating layer 94, comprising a first insulating material, is formed covering gate electrode 92. Optionally, a second insulating layer 95, comprising a second insulating material different from the first insulating material, can be formed on first insulating layer 94. The first and second insulating materials, and thickness of the first and second insulating layers, are selected in accordance with the first and second insulating materials mentioned in the embodiment illustrated with respect to FIGS. 5 through 8. However, insulating layers 94 and/or 95 are also on the sides of gate electrode 92 which also serves to offset the source/drain implants from the gate edge which is advantageous in the design of short channel transistors.

With continued reference to FIG. 9, a conventional LDD/MDD impurity implantation is conducted to form LDD/MDD source/drain implants 93. An insulating sidewall spacer 96 is selectively formed on the drain side of gate electrode 92. Sidewall spacer 96 can be formed by depositing a layer of spacer material, masking and etching in a conventional manner. Sidewall spacer 96 can be formed of any conventional spacer material, such as silicon dioxide, polycrystalline silicon, silicon nitride, silicon oxynitride.

Using sidewall spacer 96 as a mask, an HDD impurity implantation is conducted to form HDD source/drain implants 97, thereby substantially completing the basic asymmetric source/drain structure.

As in the previously disclosed embodiment illustrated with respect to FIGS. 5 through 8, one having ordinary skill would understand that the asymmetric source/drain regions of the present invention are actually completed or activated by thermal treatment. Such thermal treatment can be performed immediately after the individual impurity implantations or during subsequent processing stages. Such thermal treatments are conventional in the semiconductor art and, hence, are not set forth herein in detail.

The materials and processing techniques, such as deposition, including chemical vapor deposition, photolithographic and etching techniques, impurity implantations and materials employed in the present invention are those typically employed in manufacturing conventional semiconductor devices and, hence, not set forth herein in detail. The present invention is applicable to various types of semiconductor devices, enjoying particular applicability in high density semiconductor devices having deep sub-micron design features and requiring high generating speeds. The present invention is, therefore, applicable to any of various types of semiconductor devices, including CMOS technology and electrically programmable devices.

Figure 10:
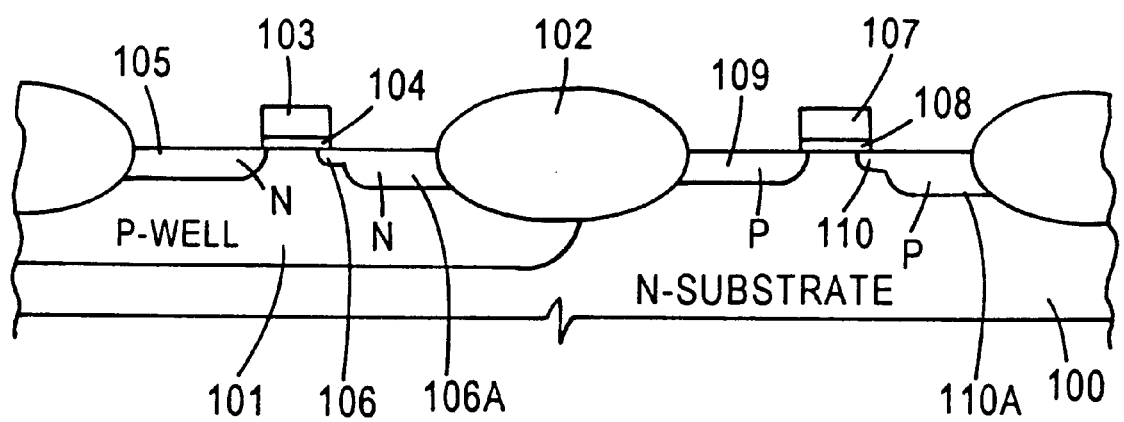
FIG. 10 schematically illustrates a CMOS structure formed by the method of the present invention.

For example, a typical asymmetrically doped structure for a CMOS device is shown in FIG. 10 and comprises n-type substrate 100 and p-well 101 formed therein. Active regions are isolated by field oxide regions 102. An N-MOS transistor comprises gate electrode 103 with gate insulating layer 104 thereunder, source region 105 and drain region comprising LDD implant 106 and HDD implant region 106A. The PMOS transistor comprises gate electrode 107 with gate insulating layer 108 thereunder, source region 109 and drain region comprising LDD implant 110 and HDD implant region 110A.

The present invention advantageously avoids the adverse impact on transistor characteristics attendant upon conventional asymmetric methodology, wherein an excessive impurity dosage region is formed in the gate electrode with consequent impurity penetration through the gate insulating layer into the channel region of the semiconductor substrate, thereby deteriorating transistor characteristics, as by shifting the threshold voltage. In accordance with the present invention, a protective insulating layer is formed on the gate electrode during HDD implantation, thereby substantially preventing impurity penetration of the gate electrode to form an excessively dosed region therein. The present invention, therefore, provides a cost effective, simplified technique for manufacturing a semiconductor device, particularly for deep sub-micron transistor generations, exhibiting high performance, i.e., a high drive current, and high reliability, particularly with respect to hot carrier injection, increased operating speed and improved signal-to-noise ratio.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device containing a transistor having asymmetrically doped source/drain regions, which method comprises, sequentially:

forming a gate electrode having side surfaces on a semiconductor substrate with a gate insulating layer therebetween;

implanting impurity ions into the semiconductor substrate, using the gate electrode as a mask to form LDD or MDD source/drain implants having a first impurity concentration;

depositing a first insulating layer, comprising a silicon oxide, on the gate electrode, including the side surfaces thereof;

depositing a second insulating layer, comprising an insulating material different from the first insulating material, on the first insulating layer;

etching through a photoresist mask to remove portions of the first and second insulating layers from the semiconductor substrate, leaving portions of the first and second insulating layers on the gate electrode, including the side surfaces thereof;

depositing a layer of spacer material;

forming a photomask to shield the drain region;

etching the layer of spacer material through the photoresist mask leaving the sidewall spacer on the side surface of the gate electrode adjacent the drain region; and implanting impurity atoms into the semiconductor substrate, using the sidewall spacer as a mask, to form HDD source/drain implants having an impurity concentration greater than the first impurity concentration.

2. A method of manufacturing a semiconductor device containing a transistor having asymmetrically doped source/drain regions, which method comprises:

forming a gate electrode having side surfaces on a semiconductor substrate with a gate insulating layer therebetween;

implanting impurity ions into the semiconductor substrate, using the gate electrode as a mask, to form LDD or MDD source/drain implants having a first impurity concentration;

depositing a first insulating layer, comprising a first insulating material, on the gate electrode, including the side surfaces thereof, and the semiconductor substrate;

depositing a second insulating layer, comprising an insulating material different from the first insulating material, on the first insulating layer;

etching through a photoresist mask to remove portions of the first and second insulating layers from the semiconductor substrate, leaving portions of the first and second insulating layers on the gate electrode, including the side surfaces thereof;

depositing a layer of spacer material;

forming a photomask to shield the drain region; and etching the layer of spacer material through the photoresist mask leaving the sidewall spacer on the side surface of the gate electrode adjacent the drain region; and implanting impurity atoms into the semiconductor substrate, using the sidewall spacer as a mask, to form HDD source/drain implants having an impurity concentration greater than the first impurity concentration, wherein the first insulating layer comprises a silicon oxide.

* * * * *